US005239209A

United States Patent [19]
Hoekman

[11] Patent Number: 5,239,209
[45] Date of Patent: Aug. 24, 1993

[54] ZERO CROSSING DETECTION CIRCUIT

[75] Inventor: Earl B. Hoekman, Roseville, Minn.

[73] Assignee: Minnesota Mining and Manufacturing Company, St. Paul, Minn.

[21] Appl. No.: 716,074

[22] Filed: Jun. 17, 1991

[51] Int. Cl.⁵ .................. H03K 5/153; H03K 17/13
[52] U.S. Cl. .................... 307/351; 307/354; 307/647
[58] Field of Search .......... 307/351, 354, 311, 647, 307/568, 318

[56] References Cited
U.S. PATENT DOCUMENTS

| | | | |
|---|---|---|---|
| 3,943,339 | 3/1976 | Koerner et al. | 235/92 |
| 3,967,257 | 6/1976 | Hager | 340/253 |
| 3,989,932 | 11/1976 | Koerner | 235/92 |
| 3,999,087 | 12/1976 | Compton | 307/311 |
| 4,041,470 | 8/1977 | Slane et al. | 364/900 |
| 4,247,849 | 1/1981 | Morris et al. | 340/660 |
| 4,368,428 | 1/1983 | Dijkman | 324/178 |
| 4,446,841 | 5/1984 | Van Siclen, Jr. | 307/311 |
| 4,449,115 | 5/1984 | Koerner | 340/941 |
| 4,459,561 | 7/1984 | Clark et al. | 331/65 |
| 4,472,706 | 9/1984 | Hodge et al. | 340/941 |
| 4,491,841 | 1/1985 | Clark | 340/939 |
| 4,668,951 | 5/1987 | Duley et al. | 340/941 |
| 4,862,162 | 8/1989 | Duley | 340/938 |
| 4,873,494 | 10/1989 | Jefferis | 331/65 |
| 4,949,054 | 8/1990 | Briefer | 331/117 |
| 5,068,545 | 11/1991 | Molnar | 307/311 |

OTHER PUBLICATIONS

JA 0223218 Sep. 90 "Zero Cross Detection Circuit for AC Power Source" Kazuhiko Masamoto.
SU 1396259 May 88 "AC Voltage Zero crossing pulse shaper-has second lead of third resistor connected to base of the first transistor".

Primary Examiner—Jin F. Ng
Assistant Examiner—Sinh Tran
Attorney, Agent, or Firm—Gary L. Griswold; Walter N. Kirn; William B. Barte

[57] ABSTRACT

A zero crossing detection circuit produces an output signal which changes state to indicate the occurrence of a positive-going zero crossing of an AC input signal. The circuit includes first and second input terminals, a current sensitive switch such as an opto-isolator, first and second current regulators, and a voltage limiter. The first current regulator is connected in series with the current sensitive switch, and the voltage limiter is connected in parallel with the first current regulator and the current sensitive switch. The second current regulator is connected between the first input terminal and the parallel combination of the voltage limiter and the first current regulator and the current sensitive switch. The first current regulator limits current through the current sensitive switch to a first current limit level, and the second current regulator limits current flowing between the first and second input terminals to a second current limit level which is greater than the first current level. The zero crossing detection circuit offers the ability to sense zero crossings of AC input signals having a wide range of AC voltages.

15 Claims, 2 Drawing Sheets

ZERO CROSSING DETECTION CIRCUIT

BACKGROUND OF THE INVENTION

The present invention relates to a zero crossing detection circuit which is capable of operation with AC input signals having a wide range of voltage levels.

In a co-pending application entitled "VEHICLE DETECTOR WITH POWER MAIN NOISE COMPENSATION" by E. B. Hoekman and S. M. Hamer, which is assigned to the same assignee as the present application and filed on even date, a vehicle detector for a traffic control system is described. The vehicle detector compensates for noise produced by electric power distribution lines near an inductive sensor which can introduce a fluctuation in the frequency of the oscillator used by the vehicle detector to sense presence of a vehicle. In order to compensate for this fluctuation, the vehicle detector of the co-pending application senses phase of a power main signal during the time when a measurement is being made. The measurement is then compensated based upon the measured frequency of the oscillator signal, the phase of the power main signal, and a known relationship between measured frequency and the phase of the power main signal.

In the preferred embodiment shown in the co-pending application, phase of the power main signal is determined by sensing a positive going zero crossing of a power main signal. Since the frequency of the power main signal is known by measuring time between adjacent zero crossings of the same polarity, a time measurement from the positive-going zero crossing provides an indication of the phase of the power main signal.

Although zero crossing detector circuits have been known in the past, the application of a zero crossing detection circuit to a vehicle detector presents unique problems. In particular, the vehicle detector may be used anywhere in the world, and therefore the power main signal may be derived from a wide variety of different power systems. There is no single consistently available AC voltage or frequency. In addition, the available power main signal may have been stepped up or stepped down in voltage by the use of transformer. It is necessary, therefore, that the zero crossing detector circuit used in such an environment be capable of operating with an AC input signal which varies from as low as 3 volts AC to as high as 270 volts AC. In addition, the circuit must be capable of operating at various frequencies, including both 50 and 60 Hz. The zero crossing detection circuit must also dissipate only a small amount of power, so that it does not generate heat which would otherwise disrupt the operation of other components of the vehicle detector.

SUMMARY OF THE INVENTION

The circuit of the present invention uses a first current regulator in series with a current sensitive switch to produce an output signal having first and second states, while accommodating AC input signals having a wide range of possible voltage levels and while maintaining a low power dissipation. The first current regulator allows current to rise to a first current limit level which is substantially constant, essentially independent of the magnitude of AC input signal and sufficient to cause the current sensitive switch to change the output signal from the first to the second state. The first current regulator permits the AC input signal voltage to continue to increase after the output signal has changed state, without increasing current through the current sensitive switch.

In preferred embodiments, the first current level is selected to be at a very low level, such as one milliamp, so as to function as a zero crossing detector. The circuit may also include a voltage limiter connected in parallel with the series combination of the first current regulator and the current sensitive switch, together with a second current regulator connected between one of the input terminals and the first current regulator. In such an embodiment, the second current regulator limits the current flowing between the first and second input terminals of the circuit to a second current limit level which is greater than the first current limit level.

Preferred embodiments also include a second current regulator connected between one of the input terminals and the first current regulator. The second current regulator limits the current flowing between the first and second input terminals of the zero crossing detection circuit to a second current limit level which is greater than the first current limit level.

DETAILED DESCRIPTION OF THE PREFERRED EMBODIMENTS

In order to place the zero crossing detection circuit of the present invention in the context of its preferred use, vehicle detector 10, shown in FIG. 1, will first be described. The zero crossing detection circuit of the present invention, while being useful in other applications in which the voltage of the AC input signal can vary widely, is particularly useful in a vehicle detector of the type illustrated in FIG. 1.

Figure 1:
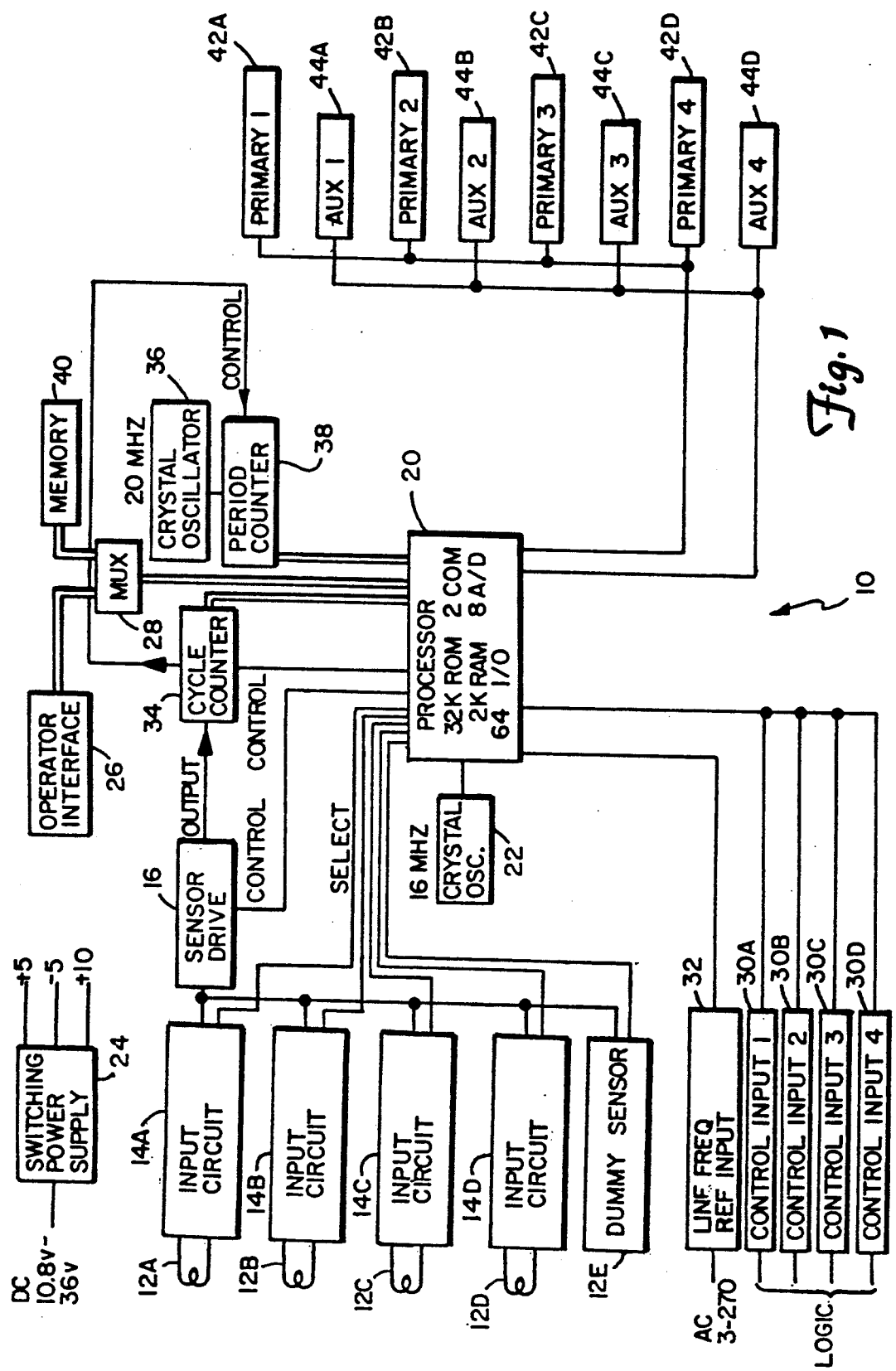
FIG. 1 is a block diagram of a vehicle detector using noise compensation for power lines near the inductive sensor.

Vehicle detector 10 shown in FIG. 1 is a four channel system which monitors the inductance of inductive sensors 12A, 12B, 12C and 12D. Each inductive sensor 12A-12D is connected to an input circuit 14A-14D, respectively. Sensor drive oscillator 16 is selectively connected through input circuits 14A-14D to one of the inductive sensors 12A-12D to provide a drive current to one of the inductive sensors 12A-12D. The particular inductive sensor 12A-12D which is connected to oscillator 16 is based upon which input circuit 14A-14D receives a sensor select signal from digital processor 20. Sensor drive oscillator 16 produces an oscillator signal having a frequency which is a function of the inductance of the inductive sensors 12A-12D to which it is connected.

Also shown in FIG. 1, dummy sensor 12E is provided and is connected to sensor drive oscillator 16 in response to a select signal from digital processor 20. Dummy sensor 12E has an inductance which is unaffected by vehicles, and therefore provides a basis for adjustment or correction of the values measured by inductive sensors 12A-12D.

The overall operation of vehicle detector 10 is controlled by digital processor 20. Crystal oscillator 22 provides a high frequency clock signal for operation of digital processor 20. Power supply 24 provides the necessary voltage levels for operation of the digital and analog circuitry within the vehicle detector 10.

Digital processor 20 receives inputs from operator interface 26 (through multiplexer 28), and receives control inputs from control input circuits 30A-30D. In a preferred embodiment, control input circuits 30A-30D receive logic signals, and convert those logic signals into input signals for processor 20.

Processor 20 also receives a line frequency reference input signal from line frequency reference input circuit 32. This input signal aids processor 20 in compensating signals from inductive sensors 12A-12D for inductance fluctuations caused by nearby power lines.

Cycle counter 34, crystal oscillator 36, period counter 38, and processor 20 form detector circuitry for detecting the frequency of the oscillator signal. Counters 34 and 38 may be discrete counters (as illustrated in FIG. 1) or may be fully or partially incorporated into processor 20.

In a preferred embodiment of the present invention, digital processor 20 includes on-board read only memory (ROM) and random access memory (RAM) storage. In addition, non-volatile memory 40 stores additional data such as operator selected settings which are accessible to processor 20 through multiplexer 28.

Vehicle detector 10 has four output channels, one for each of the four sensors 12A-12D. The first output channel, which is associated with inductive sensor 12A, includes primary output circuit 42A and auxiliary output circuit 44A. Similarly, primary output circuit 42B and auxiliary output circuit 44B are associated with inductive sensor 12B and form the second output channel. The third output channel includes primary output circuit 42C and auxiliary output circuit 44C, which are associated with inductive sensor 12C. The fourth channel includes primary output circuit 42D and auxiliary output circuit 44D, which are associated with inductive sensor 12D.

Processor 20 controls the operation of primary output circuits 42A-42D, and also controls the operation of auxiliary output circuits 44A-44D. The primary output circuits 42A-42D provide an output which is conductive even when vehicle detector 10 has a power failure. The auxiliary output circuits 44A-44D, on the other hand, have outputs which are non-conductive when power to vehicle detector 10 is off.

In operation, processor 20 provides sensor select signals to input circuits 14A-14D to connect sensor drive oscillator 16 to inductive sensors 12A-12D in a time multiplexed fashion. Similarly, a sensor select signal to dummy sensor 12E causes it to be connected to sensor drive oscillator 16. Processor 20 also provides a control input to sensor drive oscillator 16 to select alternate capacitance values used to resonate with the inductive sensor 12A-12D or dummy sensor 12E. When processor 20 selects one of the input circuits 14A-14D or dummy sensor 12E, it also enables cycle counter 34. As sensor drive oscillator 16 is connected to an inductive load (e.g., input circuit 14A and sensor 12A) it begins to oscillate. The oscillator signal is supplied to cycle counter 34, which counts oscillator cycles. After a brief stabilization period for the oscillator signal to stabilize, processor 20 enables period counter 38, which counts in response to a very high frequency (e.g., 20 MHz) signal from crystal oscillator 36.

When cycle counter 34 reaches the predetermined number (Nseg) of oscillator cycles after oscillator stabilization, it provides a control signal to period counter 38, which causes counter 38 to stop counting. The final count contained in period counter 38 is a function of the frequency of the oscillator signal, and therefore the inductance of inductive sensor 12A.

In a preferred embodiment of the present invention, each measurement period (which is defined by a predetermined number of oscillator cycles) constitutes a "frame segment" of a larger "measurement frame". Each time a frame segment is completed, the final count from period counter 38 is combined with a number which is derived from the final counts produced during earlier frame segments to produce a measurement value. This measurement value is a function of the frequency of the oscillator output signal during the just-completed frame segment, as well as frequency measured during earlier frame segments.

The measurement value is then compared to a reference value. If the measurement value exceeds the reference value by greater than a threshold value, this indicates that a vehicle is present, and processor 20 provides the appropriate output signal to the appropriate primary and auxiliary output circuit.

If there are power lines near one of the inductive sensors 12A-12D, the magnetic flux produced by the current flowing through the power line will affect the oscillator frequency. Because the measurement period of the frame segment in making a single measurement is usually much shorter than the period of the main power signal, the final count contained in period counter 38 will differ depending upon when the measurement was taken during the cycle of the main power signal. The present invention compensates for the power line induced noise by characterizing the change in frequency measured as a function of the phase of a main power signal, and then using that information to adjust the measurement value (or the reference value) as a function of the phase of the main power signal when the frame segment measurement was made.

During an initialization period, digital processor 20 causes a series of measurement samples to be taken on a single inductive sensor. In other words, during the initialization period, oscillator 16 will be connected first to inductive sensor 12A and a predetermined number of sample frame segments will be performed at different phases of the line frequency. In one preferred embodiment of the present invention, a total of eight consecutive samples will be made with a single inductive sensor before the next inductive sensor is connected to sensor drive oscillator 16 and the initialization process is repeated.

The result of the eight consecutive sample frame segments will be eight sample values representing the ending count from period counter 38 at the end of each of the eight sample frame segments. If there is line frequency noise affecting the loop which is connected to oscillator 16, the eight sample values will vary in a pattern which is usually, but not always, sinusoidal.

Line frequency reference input circuit 32 provides a logic signal to processor 20 which indicates the positive-going zero crossing of the power main signal which is supplied to circuit 32. Because the line frequency is known by measuring the time period between adjacent zero crossings of the same polarity, it is possible to determine the phase of the power main signal simply by measuring time after a detected positive-going zero crossing. Processor 20 uses an internal counter, which counts clock pulses from oscillator 22, to provide a measurement of time following a positive-going zero crossing indicated by a logic signal from line frequency reference input circuit 32.

Processor 20 records the time at which each sample frame segment begins and ends. Using the beginning and ending times, processor 20 calculates a mid-point time for each sample frame segment.

Processor 20 then determines from among the eight samples the maximum count Cntmax (which corresponds to the lowest frequency measured) and the minimum count Cntmin (which represents the highest frequency measured).

If there is no moving vehicle present in the initialization, the maximum and minimum sample value counts should be 180° apart in the line frequency noise waveform even if it is not sinusoidal. If a moving vehicle is present, the phase relationship between the maximum and minimum counts will typically not be 180° apart. Processor 20 checks the phase relationship of the maximum and minimum counts by comparing the difference between the time of the maximum count and the time of the minimum count and comparing that value to one half of the total time from one positive-going zero crossing to the next.

$$|Tcntmax - Tcntmin| \approx Tline/2 \qquad \text{Equation 1}$$

where

Tcntmax = time from zero crossing to Cntmax
Tcntmin = time from zero crossing to cntmin
Tline = time from zero crossing to zero crossing If Equation 1 is satisfied, processor 20 assumes that the inductive sensor was clear (i.e. no moving vehicle present). If Equation 1 is not satisfied, this indicates that a moving vehicle is present and initialization must be performed again after the vehicle has left the inductive sensor.

The initialization process is performed for each inductive sensor 12A-12D. Once the initialization process has been completed, vehicle detector 10 enters a normal measurement mode, in which each inductive sensor 12A-12D is connected to sensor drive oscillator 16 in a time-multiplexed, sequential fashion. Each inductive sensor 12A-12D is connected in turn to sensor drive oscillator 16 for a measurement frame segment which represents a predetermined number of cycles of the oscillator signal. During the normal operation, line frequency reference input circuit 32 provides a logic signal to processor 20 which indicates each positive-going zero crossing of the power main signal. The beginning and ending times of each measurement frame segment relative to the most recent positive-going zero crossing is measured by processor 20. From that information, processor 20 derives a center time for each measurement frame segment.

Based upon the count in period counter 38 at the end of the measurement frame segment, processor 20 calculates a measurement value which it compares to a reference value. If the measurement value exceeds the reference value by a predetermined threshold value, processor 20 determines that a vehicle is present, and provides the appropriate output signals to the particular primary and auxiliary output circuits corresponding to the particular inductive sensor that was being interrogated.

Line frequency noise is compensated by adjusting the measurement value as a function of phase of the power main signal at the time the measurement frame segment occurred. This compensation is done by subtracting a compensation value from the count for the just-completed measurement frame segment.

The compensation value (Comp) depends upon the time at which the measurement frame segment took place ($T_{meas}$) and the amplitude of the line frequency noise. For sinusoidal noise, amplitude is half the difference between the maximum count Cntmax and the minimum count Cntmin during the initiation period.

$$Comp = (\sin(\omega t_{meas})) (Cntmax - Cntmin)/2 \qquad \text{Equation 2}$$

When noise is asymmetric, the compensation values must be stored as a set of values with each value related to the phase of the line at which it was measured. In this case, each value can be regarded as a reference value to which the measurement value may be compared. The particular reference value to which the measurement value is compared will depend on the average phase of the line at the time when the measurement value was measured.

Once the variation in the measured frequency as a function of phase of the power main signal has been performed during initialization, that characterization can be used for many measurement frame segments before updating is required. This assumes that there are no significant fluctuations in power levels. Updating of the line frequency noise compensation should be performed frequently enough that inaccuracies do not occur, while not being used so frequently that it significantly increases overhead of the system compared to time being used for measurement.

The compensation of line frequency noise is also based upon the assumption that any line frequency noise will maintain a constant phase relationship to the power main signal which is supplied to the input of line frequency reference input circuit 32. As long as any power lines near the inductive sensors 12A-12D are connected to the same power grid as the power main signal supplied to line frequency reference input circuit 32, the assumption of a constant phase relationship should be valid. For example, the compensation value for a particular phase may be updated on a continuous basis by keeping a running average of samples of the same phase, each taken when the sensor is not affected by a vehicle.

In this particular embodiment, the compensation value is subtracted from the measurement value (or from the count for the frame segment). Alternatively, the compensation value could be added to the reference value or could be subtracted from the difference between the measurement and reference values. Also, the compensation value may be set to represent the reference value for measurements taken at any phase of the mains signal. Similarly, although eight sample values are specifically described, any number of samples which are adequate to characterize the fluctuation of measured frequency with phase of the power main signal can be used.

Figure 2:
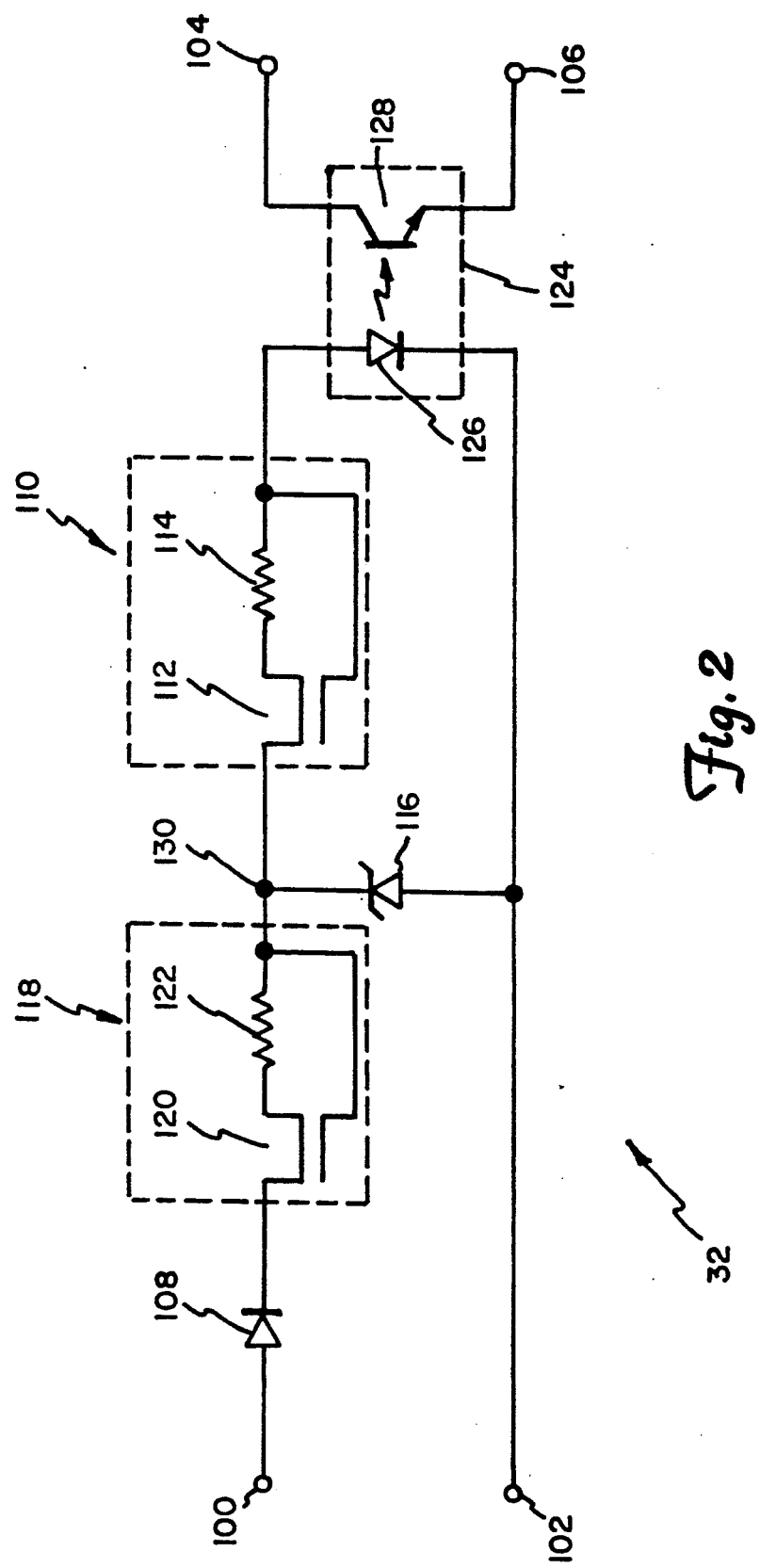
FIG. 2 is an electrical schematic diagram of the zero crossing detection circuit of the present invention, which provides a line frequency reference input to the vehicle detector of FIG. 1.

FIG. 2 shows a preferred embodiment of a line frequency reference input circuit 32. The circuit shown in FIG. 2 is capable of operating with alternating current (AC) power main signals which vary from 3 volts AC to 270 volts AC. The need for this vary wide operating range arises because the power main signal available in the field for connection to circuit 32 can vary significantly depending upon whether the power main signal is directly from power lines, or has been stepped down by a transformer. In addition, the circuit of FIG. 2 permits operation at either U.S. or European line voltages and frequencies.

Line frequency reference input circuit 32 of FIG. 2 includes a pair of input terminals 100 and 102, a pair of output terminals 104 and 106, diode 108, first current regulator 110 (formed by depletion mode FET 112 and resistor 114) voltage limiter 116 (which is a transient suppression semiconductor breakdown device), second current regulator 118 (formed by depletion mode FET 120 and resistor 122), and a current sensitive switch in the form of opto-isolator 124 (formed by light emitting diode (LED) 126 and phototransistor 128).

Input diode 108 is connected to input terminal 100. It half-wave rectifies the power main signal which is applied between terminals 100 and 102.

First current regulator 110 permits current through LED 126 to rise up to a first current limit level of one milliamp. LED 126 is capable of turning on with one milliamp of drive current. Once the voltage at terminal 100 has risen with respect to the voltage at terminal 102 so that diode 108 turns on, current regulators 110 and 118 will initially permit up to one milliamp to flow between terminals 100 and 102 (since voltage limiter 116 is off and the only conducting current path is through first current regulator 110).

As soon as the voltage between terminals 100 and 102 has risen to a level where diode 108 and LED 126 turn on, light from LED 126 causes the photo-transistor 128 to turn on. This pulls output terminal 104 down toward the potential of terminal 106, so that the output logic signal changes from a first to a second state. This logic transition indicates that a positive-going zero crossing of the power main signal has occurred.

As the voltage at input terminal 100 continues to rise with respect to terminal 102, the voltage between source and drain of FET 112 rises, and thus the voltage at node 130 rises until the breakdown voltage of voltage limiter 116 is reached. At that point, second current regulator 118 begins to regulate the current up to a maximum of 2 milliamps. The voltage drop across second current regulator 118 increases until the power main input signal reaches its positive peak voltage. Voltage limiter 116 is capable of drawing at least 1 milliamp at its breakdown voltage, and therefore the current drawn through second current regulator 11B will be split between voltage limiter 116 and first current regulator 110.

LED 126 will remain on, and photo-transistor 128 will remain on, until the voltage between terminals 100 and 102 drops to a level at which current to LED 126 drops below a threshold value (less than one milliamp) and LED 126 turns off. This will be slightly before the negative going zero crossing of the power main signal.

As the power main signal continues through its negative half cycle, LED 126 and photo-transistor 128 remain off. At the next positive-going zero crossing, LED 126 will again turn on as soon as the voltage at terminal 100 is sufficiently positive with respect to terminal 102 to turn on diode 108 as well as LED 126.

The line frequency input circuit of FIG. 2 can be used with a very wide range of input voltages (from about 3 to 270 volts AC). In addition, because of the current limiting operation of first and second current regulators 110 and 118 in conjunction with voltage limiter 116, the total current draw of circuit 32 is very low (typically two milliamps). Thus the power consumption is very low, and circuit 32 does not contribute excess heat which could affect other components of vehicle detector 10.

In a preferred embodiment of the present invention, the following components were used:

TABLE I

| | |
|---|---|
| Diode 108 | IN4007 |
| FET 112 | ND2020L |
| Resistor 114 | 1800 ohms |
| Voltage limiter 116 | SMBJ170A (189 volt breakdown) |
| FET 120 | ND2020L |
| Resistor 122 | 820 ohms |
| Opto-Isolator 124 | IL217 |

Although the present invention has been described with reference to preferred embodiments, workers skilled in the art will recognize that changes may be made in form and detail without departing from the spirit and scope of the invention. For example, in depending on the breakdown voltages of FETs used in the current regulators, more than two current regulators and more than one voltage limiter may be desirable in some applications in order to achieve a desired range of AC line voltages.

What is claimed is:

1. A circuit for producing an output signal having a first state and a second state as a function of an AC input signal, the circuit comprising:
   first and second input terminals for receiving the AC input signal;
   current sensitive switch means for producing the output signal when current therethrough is substantially equal to a first current level;
   a first current regulator connected in a series path with the current sensitive switch means between the first and second input terminals for limiting a current through the current sensitive switch means to said first current level which is substantially constant, essentially independent of the magnitude of said AC input signal, and sufficient to cause the current sensitive switch means to change the output signal from the first state to the second state, while permitting voltage across the first current regulator means to vary;
   a voltage limiter connected in parallel with the first current regulator and the current sensitive switch means for limiting voltage across the first current regulator and the current sensitive switch means, and
   a second current regulator connected in series with the first current regulator and the current sensitive switch means between the first and second input terminals for limiting current between the first and second terminals to a second, substantially constant, current level which is greater than the current level.

2. The circuit of claim 1 and further comprising:
   rectifying means connected between the first input terminal and the second current regulator for rectifying the AC input signal.

3. The circuit of claim 1 wherein the first current regulator comprises a first depletion mode FET and a first sense resistor.

4. The circuit of claim 3 wherein the first depletion mode FET has a gate and first and second main current carrying electrodes; and wherein the first sense resistor is connected between the second main current carrying electrode and the gate.

5. The circuit of claim 3 wherein the second current regulator comprises a second depletion mode FET and a second sense resistor.

6. The circuit of claim 5 wherein the second depletion mode FET has a gate and first and second main current carrying electrodes; and wherein the second sense resistor is connected between the second main current carrying electrode and the gate of the second depletion mode FET.

7. The circuit of claim 1 wherein the voltage limiter has a first terminal connected to a node between the first and second current regulators and a second terminal connected to the second input terminal.

8. The circuit of claim 1 wherein the first current level is approximately 1mA and the second current level is approximately 2mA.

9. The circuit of claim 8 wherein the voltage limiter limits voltage to less than a breakdown voltage of the first current regulator.

10. A zero crossing detection circuit comprising:
first and second input terminals for receiving an AC input signal;
current sensitive switch means for providing an output signal having first and second states, and for providing said output signal at said second state when current therethrough is substantially equal to a first current level;
first and second current regulators connected in a first current path with the current sensitive switch means between the first and second input terminals, the first current regulator permitting current through the current sensitive switch means to rise to a first current limit level which is substantially constant, essentially independent of the magnitude of said AC input signal and sufficient to cause the output signal to change from the first state to the second state, and the second current regulator limiting current therethrough to a second, substantially constant, higher current limit level; and
a voltage limiter for limiting voltage across the current sensitive switch means and the first current regulator, the voltage limiter connected with the second current regulator in a second current path between the first and second input terminals so that current through the second current regulator is divided between the first and second current paths when the input signal reaches a predetermined voltage.

11. The circuit of claim 10 and further comprising:
rectifying means connected between the first input terminal and the second current regulator for rectifying the AC input signal.

12. The circuit of claim 10 wherein the first current regulator comprises a first depletion mode FET and a first sense resistor.

13. The circuit of claim 12 wherein the second current regulator comprises a second depletion mode FET and a second sense resistor.

14. The circuit of claim 13 wherein the voltage limiter has a first terminal connected to a node between the first and second current regulators and a second terminal connected to the second input terminal.

15. The circuit of claim 10 wherein the first current limit level is approximately 1mA and the second current limit level is approximately 2mA.

* * * * *